(12) United States Patent
Shaikh et al.

(10) Patent No.: US 7,370,170 B2
(45) Date of Patent: May 6, 2008

(54) DATA MASK AS WRITE-TRAINING FEEDBACK FLAG

(75) Inventors: Ashfaq R. Shaikh, San Jose, CA (US); Barry A. Wagner, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 514 days.

(21) Appl. No.: 10/910,050

(22) Filed: Aug. 3, 2004

(65) Prior Publication Data

US 2005/0240744 A1 Oct. 27, 2005

Related U.S. Application Data

(60) Provisional application No. 60/565,973, filed on Apr. 27, 2004.

(51) Int. Cl.
*G06F 12/00* (2006.01)

(52) U.S. Cl. .......................... 711/167; 710/52; 710/58; 345/563; 345/626

(58) Field of Classification Search ................ 711/167; 710/52, 58; 345/563, 626
See application file for complete search history.

(56) References Cited

U.S. PATENT DOCUMENTS

| | | | |
|---|---|---|---|
| 6,219,775 B1 * | 4/2001 | Wade et al. ................... 712/11 |
| 6,463,547 B1 * | 10/2002 | Bailey et al. ................ 713/500 |
| 6,574,760 B1 | 6/2003 | Mydill | |
| 7,093,061 B2 * | 8/2006 | Teo ........................... 711/101 |
| 2002/0034119 A1 | 3/2002 | Lee et al. | |
| 2004/0107324 A1 * | 6/2004 | Nystuen ...................... 711/158 |

FOREIGN PATENT DOCUMENTS

EP    1336972 A1    8/2003

OTHER PUBLICATIONS

Logic and Computer Design Fundamentals, M. Morris Mano and Charles R. Kime, Prentice-Hall Inc., New Jersey, 1997, pp. 360-361, sections 8-1 and 8-2.*

* cited by examiner

*Primary Examiner*—Stephen C. Elmore
*Assistant Examiner*—Daniel Kim
(74) *Attorney, Agent, or Firm*—Patterson & Sheridan, LLP

(57) ABSTRACT

Methods and apparatuses that enable memory devices to inform graphical processing systems about the results of WRITE de-skew training. A WRITE-TRAINING mode is added to a memory device. When the WRITE-TRAINING mode is asserted the memory data mask (DM) pin is converted to an output port. Incoming WRITE data is strobed-into the memory device and the resulting data pattern is compared to a desired pattern. If the incoming WRITE data and strobed-in data match, that result is sent to the graphical processing system by setting the DM pin HIGH. If the incoming WRITE data and the strobed-in data do not match, that result is sent to the graphical processing system by setting the DM pin LOW. Beneficially, the incoming data and the desired pattern are derived from pseudo random bit sequence (PRBS) sources.

16 Claims, 6 Drawing Sheets

DATA MASK AS WRITE-TRAINING FEEDBACK FLAG

CROSS-REFERENCE TO RELATED APPLICATIONS

This application claims the benefit of U.S. provisional patent application Ser. No. 60/565,973, entitled, Data Mask As Write-Training Feedback Flag, which was filed on Apr. 27, 2004 and which is herein incorporated by reference.

BACKGROUND

The present invention relates to high speed data interfaces, and more particularly to using a modified Data Mask (DM) pin as an error flag when de-skewing communications.

Graphics processing is an important feature of modern, high performance computer systems. Some graphical processing systems render high-resolution, real-time graphical images on display devices by using special high-performance computational circuitry that is incorporated into or that is otherwise mated with graphical processing units (GPUs).

In addition to GPUs and computational circuitry, graphical processing systems also require memory devices, usually high speed static random access memory (SRAM) or dynamic random access memory (DRAM). While SRAM and DRAM devices have been used with GPUs for many years, current demands for high resolution, high performance, real time graphics processing requires very fast memory devices. To that end, faster memory devices, such as double data rate random access memory, have been developed. A double data rate memory device clocks data into or out of memory on both the rising and falling edges of a clocking signal.

While double data rate memory devices are very useful, the sheer speed required to render high resolution digital images in real time can make the basic task of communicating with memory difficult. This is because high speed data accessing takes place over individual data lines that can differ. For example, individual data lines can have different lengths, distributed impedances, and end terminations. Those differences can cause individual bits of a data byte to arrive at a receiver at different times. Furthermore, individual receivers and drivers have transition speeds that can differ. For example, a GPU could send a data byte to a memory device with a first pattern, say 1111 0000, which, when clocked into a memory, could be recognized as 1011 0001 because the clock signal arrived before the data byte was ready to be clocked. This temporal problem is referred to as skew.

In some high speed interface circuits, for example double data rate memory, the actual clocking of data into and out of a memory device is performed using a strobe signal that is derived from a master clock. By selectively delaying the strobe signal relative to the data byte the strobe signal's edges can be shifted such that they occur after the data byte is ready. Reference U.S. provisional application No. 60/539,787 filed Jan. 27, 2004, incorporated by reference, which describes how to automatically shift strobe timing such that the strobe edges occur at times that avoid skew.

While the teachings of U.S. provisional application No. 60/539,787 filed Jan. 27, 2004 are beneficial, implementing those teachings are subject to practical constraints. For example, when adjusting strobe timing relative to data packets during WRITE de-skew training, some method of informing the GPU about the results of strobe timing is required. A straightforward way to do that would be to add a new "result" pin to the memory device and another to the GPU. Unfortunately, SRAM and DRAM memory devices, particularly, their input/output (I/O) pin configurations, are relatively standardized. While adding internal circuitry to a GPU and to a memory device to implement de-skew training is relatively straight forward, adding a new I/O pin is contrary to accepted standards.

Therefore, a method and apparatus that enables a memory device to inform a graphics processing system about the results of de-skew training during WRITE operations would be beneficial. Also beneficial would be a method and apparatus that enables a memory device to signal a graphics processing system about strobe timing relative to data packets during WRITE operations using existing memory pin-outs.

SUMMARY

The principles of the present invention enable methods and apparatus that enable memory devices to inform graphical processing systems about results obtained during WRITE de-skew training. Embodiments of the present invention implement WRITE de-skew training circuitry within the memory device and/or within the graphical processing system. The WRITE de-skew training circuitry enables WRITE de-skew training result notification using the existing memory device pin-out structure.

Embodiments of the present invention modify the memory device I/O data mask pin to a bidirectional pin and add an operational mode to the memory device that selectively converts the DM pin to an output port. Circuitry provides for a comparison between incoming data and strobed-in data. When the incoming data and the strobed-in data match, that result is made available by setting the DM pin HIGH. When the incoming data and the strobed-in data do not match, that result is made available by setting the DM pin LOW. Beneficially, the incoming data is derived from a pseudo random byte source (PRBS), and the comparison is made using the strobed-in data and another pseudo random byte source (PRBS).

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiment thereof which is illustrated in the appended drawings.

DESCRIPTION OF A SPECIFIC EMBODIMENT

Embodiments of the present invention enable memory devices to inform graphical processing systems about the results of WRITE de-skew testing using existing memory device pin-outs. A WRITE-TRAINING mode is added to the operational modes of a memory device. When the WRITE-TRAINING mode is asserted the memory data mask (DM) pin is converted to an output port. Incoming WRITE data is strobed into the memory device and the resulting data pattern is compared to a desired data pattern. If the incoming WRITE data and the strobed in data match, that result is sent to the graphical processing system by setting the DM pin HIGH. If the incoming WRITE data and the strobed-in data do not match, that result is sent to the graphical processing system by setting the DM pin LOW. Beneficially, the incoming data and the desired pattern are derived from pseudo random byte sources (PRBS).

Figure 1:
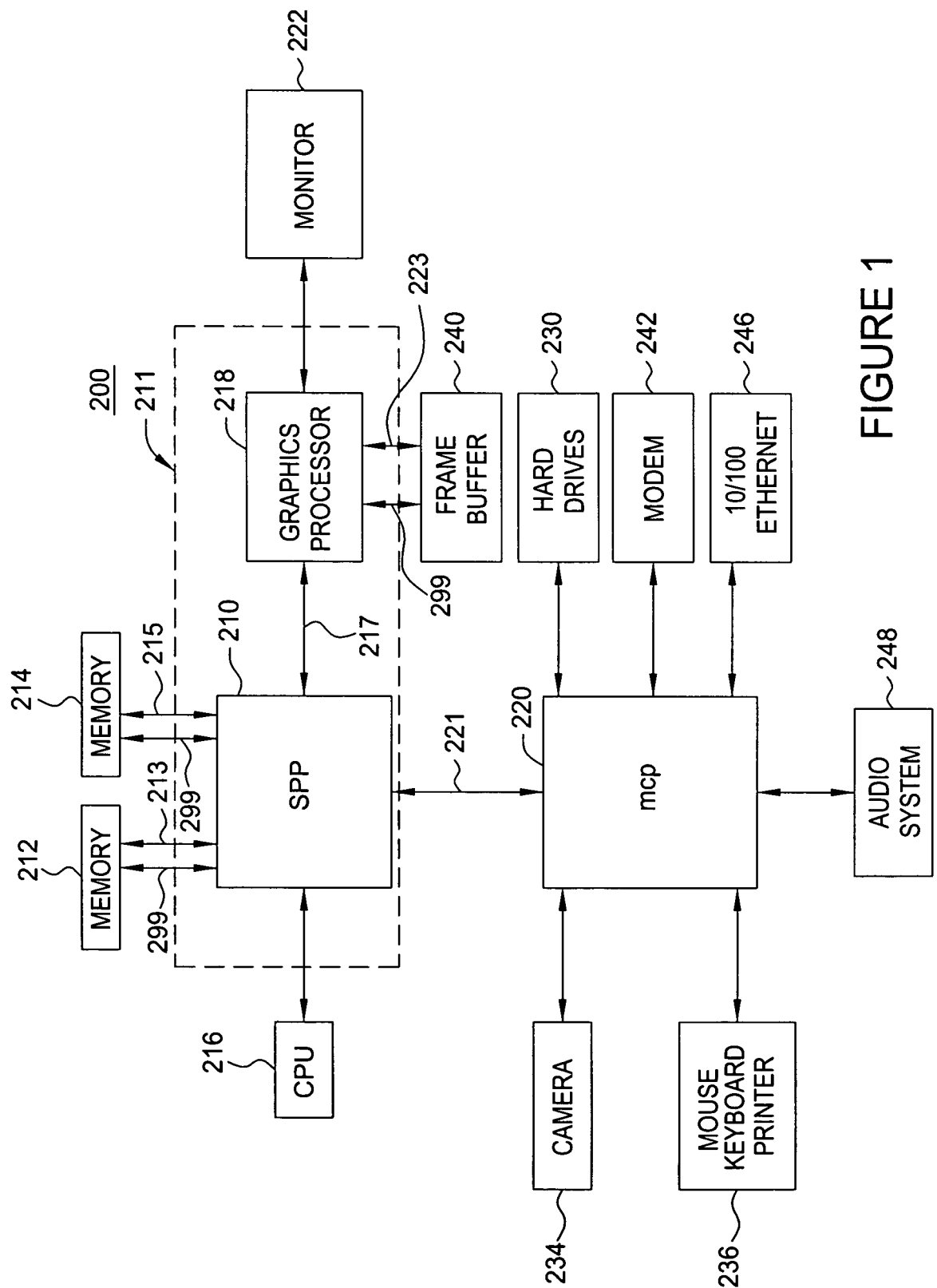
FIG. 1 is a block diagram of a computer system that is in accord with the principles of the present invention.

FIG. 1 is a block diagram of a computer system 200 that is in accord with the principles of the present invention. The computer system 200 has a graphical processing system 211 that includes a system platform processor (SPP) 210 and a graphics processor 218. The computer system 200 also includes a media communications processor (MCP) 220, memory device 212 and 214, a central processing unit (CPU) 216, a frame buffer memory 240, a monitor 222, a camera 234, mouse, keyboard, and printer I/O devices 236, hard drives 230, a modem 242, an Ethernet card 246, and an audio system 248.

The computer system 200 architecture is a distributed processing system that frees the CPU 216 to perform tasks it is best suited for while allowing the graphical processing system 211 to perform the tasks it is best suited for. Specifically, the graphical processing system 211 performs graphics processing tasks that in the prior art were performed by a central processor. While the graphics processor 218 is shown as being external to the SPP 210, in practice it may be beneficial to integrate the graphics processor 218 and the SPP 210 together. Further enhancing distributed processing; the MCP 220 includes an audio processing unit (APU) that performs many of the audio computations that were previously done by a central processor. The MCP 220 also provides for interfacing to USB, modem, and Ethernet devices, another task that was previously performed by a central processor.

The graphical processing system 211 communicates with the memory devices 212 and 214 over buses 213 and 215 and with the graphics processor 218 over an AGP bus 217. The graphics processor 218 also communicates with the frame buffer 240 via a bus 223. It should be understood that the computer system 200 is exemplary only, and that numerous modifications are possible. For example, the monitor 222 may be driven by the SPP 210 or by a separate display card, there may be more than one monitor 222, various external devices can be added (such as a scanner). In fact, hundreds, possibly thousands of alternatives could exist. However, the computer system 200 is in accord with the principles of the present invention and implements the teachings of U.S. provisional application No. 60/539,787 filed Jan. 27, 2004 incorporated herein by reference. Furthermore, the computer system 200 includes bi-directional data mask (DM) lines 299 that extend between the memory devices 212 and 214 and the graphical processing system 211 and between the frame buffer 240 and the graphical processing system 211 (specifically the graphics processor 218). It should be noted that while FIG. 1 shows bi-directional data mask (DM) lines 299 that extend between specific memory devices (the frame buffer is a memory) and the graphical processing system 211, in general, the principles of the present invention are also applicable to other portions of computer systems.

The memory device 212 is a double data rate SRAM while the memory device 214 is a double data rate DRAM. The frame buffer 240 will generally be either an SRAM or a DRAM, but other types of random access memory are contemplated. While those memory devices 212, 214 and 240 are described in more detail subsequently, it should be noted that prior art SRAM and DRAM devices have standardized pin-outs that include read/write strobe lines (DQS) and Data Mask (DM) lines. For simplicity, the read/write strobe lines (DQS) and the signals it propagates are referred to as strobe lines and strobe signals. The strobe lines control the transfer of data to and from the memory devices. In the prior art the DM lines were unidirectional lines that controlled WRITE operation. That is, in prior art memory devices if a DM line is set high, the attached memory device will not WRITE incoming data even when the associated strobe line changed state. If the DM line was LOW, the attached memory device would WRITE incoming data when the associated strobe line changed.

Figure 2:
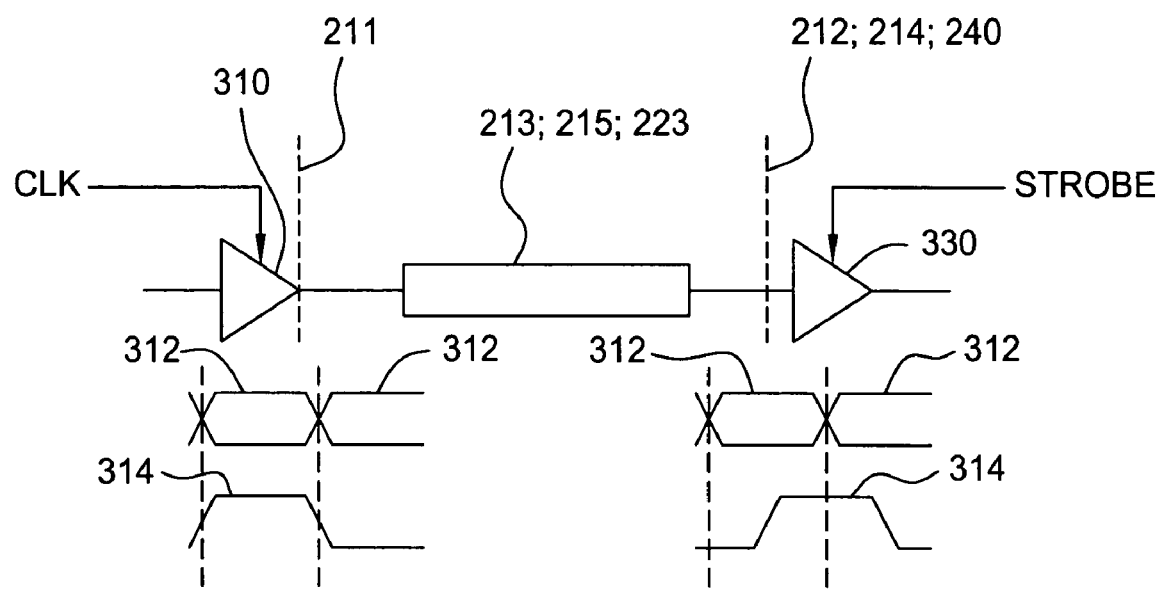
FIG. 2 is a simplified block diagram showing relationships between data and strobe signals.

FIG. 2 is a simplified block diagram showing a single data driver 310 that is located within the graphical processing system 211, a bus interface (213; 215; 223), a single receiver 330 that is within a memory device 212, 214 or the frame buffer 240, and exemplary timing relationships between data outputs 312 from a plurality of data drivers 310 and associated strobe signals 314. As suggested in FIG. 2, the timing relationship between the data outputs 312 and the strobe signals 314 can be varied. For example, the data signals 312 can be clocked out from the data drivers at fixed times relative to a master clock. Then, the strobe signals 314, which clock the outputs of receivers 330, can be delayed relative to that master clock. The idea is to clock out a special data pattern on the data drivers 310, delay slightly, and then strobe out the same data pattern from the receivers 330. Unfortunately, how much to delay the strobe signals 314 relative to the master clock such that a correct output is obtained from receivers 330 is not readily known, nor in the prior art was there any automated method of correctly determining the correct delay.

For example, if in FIG. 2 a known data pattern was clocked out of data drivers 310, and if the strobe signal 314 changed state before the inputs to corresponding receivers 330 had stabilized for the required minimum time, the receivers 330 would output incorrect data because one or more of the bits from a data driver 310 becomes skewed, that is, temporally offset, before it is clocked into a receiver 330. This condition is suggested by the left side of FIG. 2. However, if the strobe signal is properly delayed, the inputs to the receivers 330 would have stabilized and the correct pattern would result. This condition is suggested by the right side of FIG. 2. Accordingly, it is desirable to optimize the delay of the strobe signals 314, preferably automatically.

Figure 3:
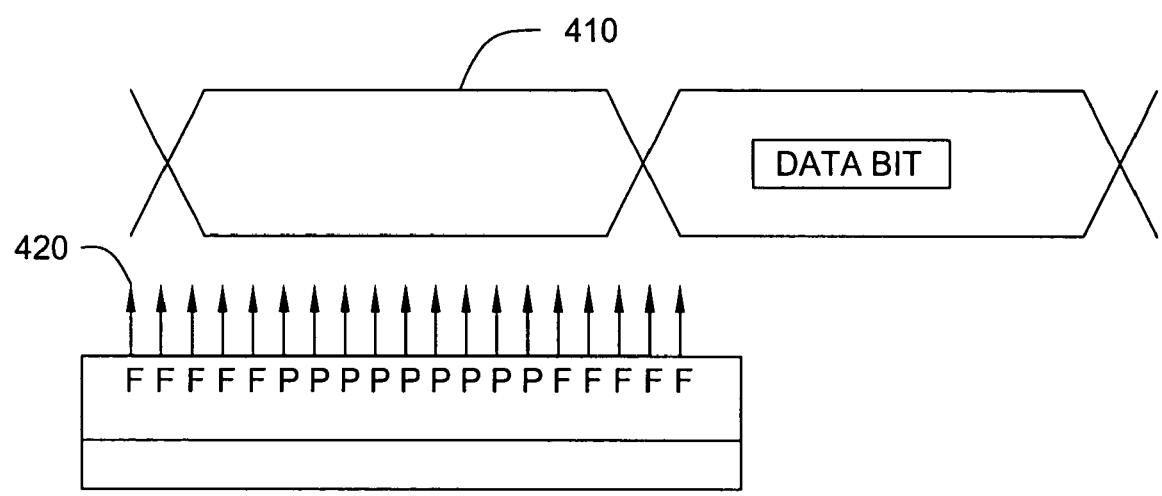
FIG. 3 helps explain how strobe to data timing results can be used to automatically adjust the delay of a strobe signal to de-skew a communication link.

To automatically optimize the delay, U.S. provisional application No. 60/539,787 filed Jan. 27, 2004 discloses a training sequence that trains the graphical processing system 211 to properly delay the strobe signals 314. FIG. 3 helps explain a method of automatically adjusting the strobe signal delay during a WRITE training operation using a special training data pattern 410. In FIG. 3, the strobe signals 314 are shifted in discrete steps from a minimum delay to a maximum delay. For example, a sequence of strobe signals 314 (not specifically shown in FIG. 4, but they have state transitions that occur just before results 420), separated by the discrete step, is phase delayed relative to master clocks; say from 60 degrees to 120 degrees. Prior to each strobe signal 314 a special data pattern 410 is sent, say at approximately a 1 GHz rate. The output of the receivers 330 are monitored slightly after each strobe signal 314 (to allow the receiver 330 outputs to stabilize). Those outputs are compared to the special data pattern 410 by a special state machine (which is discussed in more detail subsequently). The result 420 of each compare is obtained. If the outputs of the receivers 330 match the special test pattern 410, the result 420 is a pass (P). Otherwise, the result 420 is a fail (F). It should be noted that discrete stepping is not actually required since a variable step can work, but a discrete step may be more convenient. Usually, as shown in FIG. 3, the pass results P will be grouped together between fail results.

As disclosed in U.S. provisional application No. 60/539,787 filed Jan. 27, 2004 the foregoing test process is performed automatically and the strobe signal 314 delay is adjusted to occur at or about mid-way in the pass grouping. While the foregoing is beneficial, in practice, the graphical processing system 211 controls the foregoing processes, which produces a problem. The graphical processing system 211 sends the strobe signals 314, sends the special data pattern 410, determines the proper delay between the master clocks and the strobe signals, and adjusts that delay. Thus, the graphical processing system 211 needs to know when the compare results 420 are pass or fail. But, those results are within the memory devices 212, 214, or frame buffer 240. That is, the receivers 330 and the comparing state machines are, in practice, within the memory devices 212, 214 and the frame buffer 240. The compare results must be made available to the graphical processing system 211.

As previously noted, prior art double data rate SRAM and DRAM devices have standardized pin-outs. Those standardized pin-outs do not include a spare I/O pin. Furthermore, most of the standard pins have fixed functions that should not be disturbed. Industry would be highly reluctant to accept a new pin-out to incorporate the required signaling to the graphical processing system 211. However, the memory 212 (SRAM), the memory 214 (DRAM), and the frame buffer 240 are special memory devices that enable the required compare result signaling without changing the existing pin-out structure and while leaving existing pin functions in tact.

Figure 4:
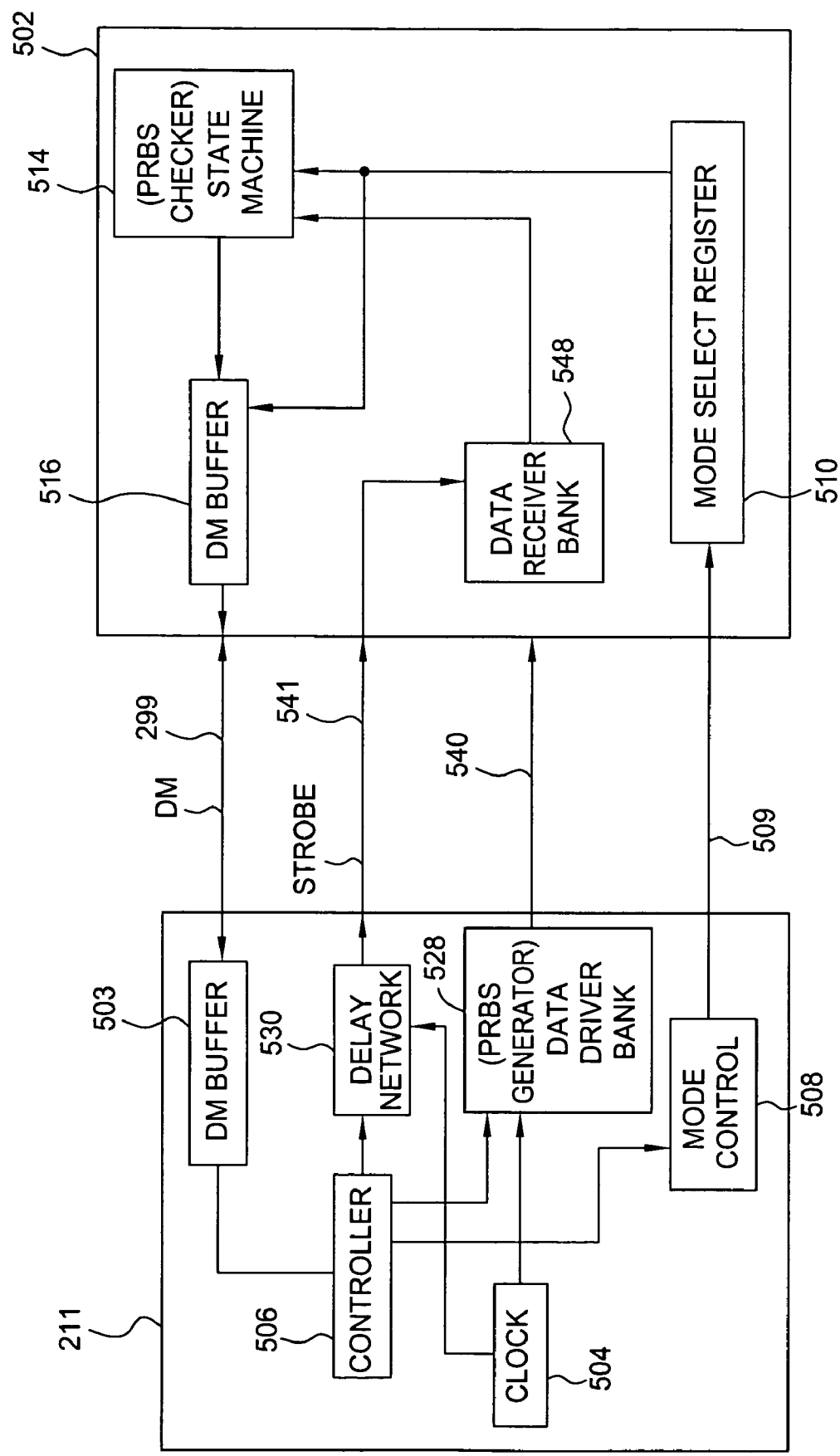
FIG. 4 illustrates portions of a communication link that is in accord with the principles of the present invention.

FIG. 4 illustrates a portion of the interface between the graphical processing system 211 and a memory device 502. The memory device 502 generically represents a memory device, such as the SRAM memory device 212, the DRAM memory device 214, or the frame buffer 240. FIG. 4 also illustrates various functional blocks within the graphical processing system 211 and within the memory device 502. During WRITE de-skew training, that is, when the time delay between master clocks from a master clock 504 and the strobe signals 314 is being determined for WRITE operations, a controller 506 within the graphical processing system 211 signals a data mask (DM) buffer 503 that WRITE training will be performed. In response, the DM buffer 503 changes its DM I/O pin, which connects to a DM line 299, to act as an input. In the prior art, the DM line 299 was always an output of prior art graphical processing systems and an input to prior art SRAM and DRAM devices. Thus, support pins for the DM line 299 are already in-place. The controller 506 also signals a mode control 508 to shift to a WRITE training mode. The mode control 508 then sends a mode control command on a bus 509 to a mode select register 510 in the memory device 502. Current SRAM and DRAM devices already include a mode select register 510 and I/O pins that support the bus 509. However, the memory device 502 implements a mode that is referred to herein as WRITE TRAINING.

Upon a mode change to WRITE TRAINING, the mode select register 510 enables the outputs of a state machine 514 and changes a DM buffer 516 to assert that the DM line 299 is an output of the memory device 502. At this time, the DM line 299 is driven LOW. Thus, the DM line 299 which in the prior art was a unidirectional line is a bi-directional line in the computer system 200. After the mode change, the controller 506 causes a data driver bank 528 to begin sending out the special data pattern 410 on a bus 540 when clocked by master clocks from the master clock 504. Additionally, the controller 506 enables a delay network 530 to begin sending out a sequence of strobe signals 314 that are delayed at variable times with respect to the master clocks. The strobe signals are applied to the memory device 502 on a bus 541.

The data on the bus 541 is applied to a receiver bank 548, which is comprised of a bank of receivers 330. The strobe signals clock outputs from the receiver bank 548, which are applied to a state machine 514. When the state machine 514 recognizes the special data pattern 410 it causes the DM buffer 516 to output a HIGH signal on the DM line 299. When the state machine 516 does not recognize the special data pattern 410 it causes the DM buffer 516 to output a LOW signal on the DM line 299. The signal on the DM line 299 is received by the DM buffer 503 and applied to the controller 506. The signal on the DM is becomes a WRITE training flag that signals the result of WRITE training.

Based on the foregoing, the controller can use the state of the WRITE TRAINING flag on the DM line 299 to adjust the delay asserted by the delay network 530 so as to cause the strobe signals 314 to be centered in the pass results as described above. The special data pattern 410 is beneficially derived from a pseudo-random bit sequence (PRBS) generator, while the comparison is beneficially performed by a PRBS checker. Random generators produce random bits that effectively test all lines of a data byte as they might occur during normal operation. By using a matching random generator in the checker a comparison can be made.

Figure 5:
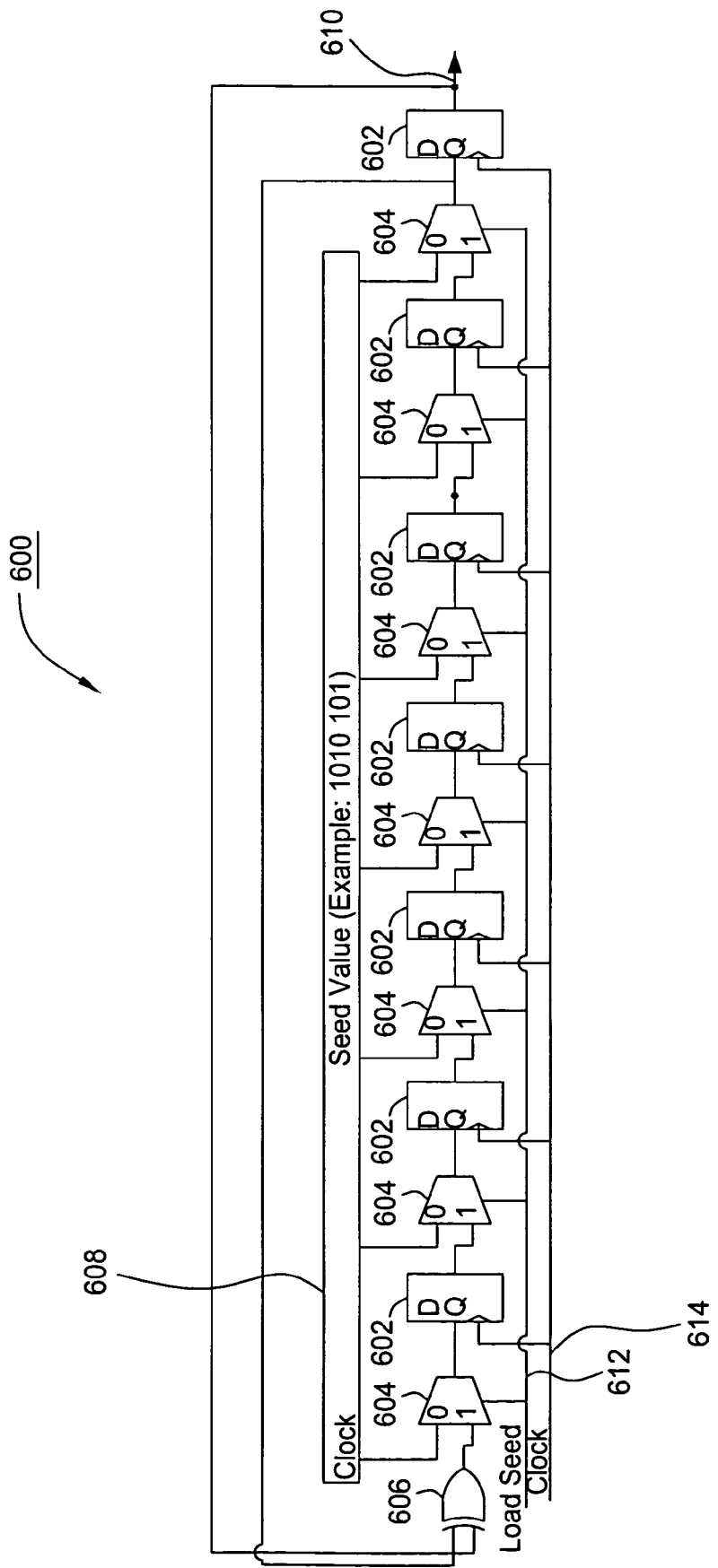
FIG. 5 illustrates a pseudo-random byte generator that is suitable for use with embodiments of the present invention.
Figure 6:
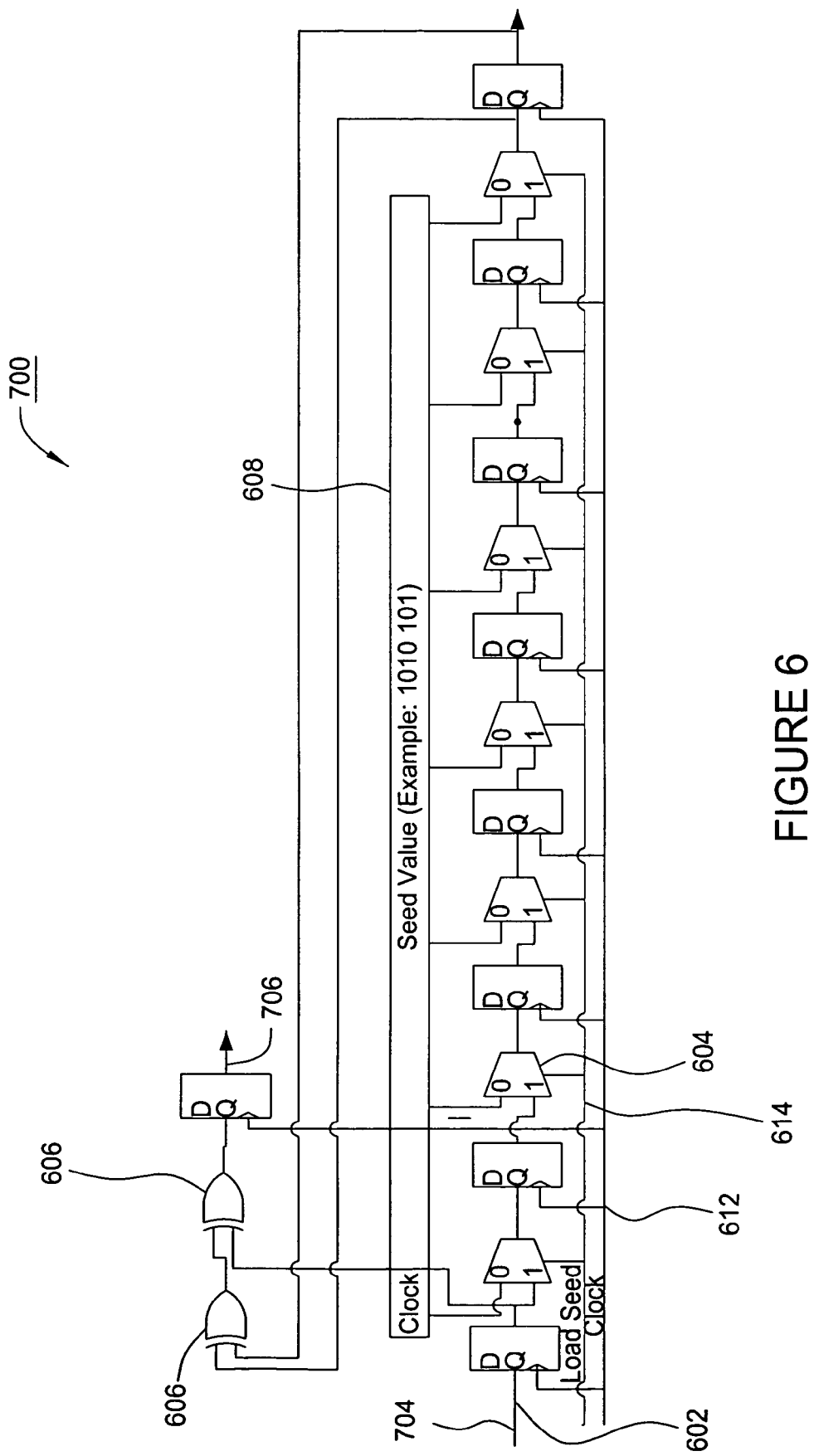
FIG. 6 illustrates a pseudo-random byte checker that is suitable for use with embodiments of the present invention.

FIG. 5 illustrates an exemplary PRBS generator 600 while FIG. 6 illustrates an exemplary PRBS checker 700. The random generators are initialized with the same seed value. Thus each next "random" state is the same.

Turning now to FIG. 5, the PRBS generator 600 is a linear feed-back random noise generator comprised of serially-connected D flip flops 602 and 221 multiplexers 604. The output of the last D flip flop 602 forms a line 610 which produces a pattern output of the random generator 600. The signal online 610 is fed back into an exclusive OR gate 606. The PRBS generator 600 is loaded with the seed value from a memory 608 when the line 612 is held high. Line 612 represents a load seed command. After the seed value has been loaded into the 221 multiplexers 604, clock signals on line 614 cause the output on pin 610 to vary in a pseudo random manner.

Turning now to FIG. 6, which shows the PRBS checker 700. That checker includes a matching pseudo random noise generator comprised of the D flip flop 602 and the 221 multiplexers 604. The pseudo random noise generator is loaded with the same seed value using the memory 608 and a load seed line 614. The output of the linear noise generator is applied to the input of an exclusive OR gate 606 which feeds into another exclusive OR gate 606. The second exclusive OR gate is connected to the output of the first D flip flop 602. An input pattern is applied on line 704, clock supplied on line 612, the data applied from the data receiver bank 548. PRBS generators in both the PRBS 600 and the checker 700 should be the same since the same seed value was loaded. The output on a pass fail line 706 goes high when the PRBS checker sees the same pattern output by the PRBS generator 600. For that to occur, skew must have been corrected for.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

The invention claimed is:

1. A random access memory device having a bi-directional data mask pin and further including:
   a mode select register that controls the directionality of said bi-directional data mask pin;
   a data mask buffer for receiving input signals on said bi-directional data mask pin and for applying signals to said bi-directional data mask pin;
   a state machine for applying a state machine output to said data mask buffer, wherein said state machine output controls the state of said bi-directional data mask pin when said bi-directional data mask pin is an output; and
   a data receiver for causing the state machine to compare said input signals against a predetermined pattern, wherein the state of said input signals on said data mask pin depends on whether said state machine finds said predetermined pattern as well as a control signal from said mode select register.

2. A computer system, comprising:
   a processing system for receiving a signal on a data mask line; and
   a random access memory device having a bi-directional data mask pin connected to said data mask line, said random access memory device including a data mask buffer for selectively impressing said signal on said data mask line, wherein said random access memory device includes a mode select register that controls the directionality of said bi-directional data mask pin; and
   a data receiver for causing the state machine to compare said signal against a predetermined pattern, wherein the state of said signal on said data mask line depends on whether said state machine finds said predetermined pattern as well as a control signal from said mode select register.

3. The system of claim 2, wherein said random access memory device further includes a state machine that controls the state of said signal when said bi-directional data mask pin is an output.

4. The system of claim 3, wherein said processing system includes a mode control for producing a mode control signal on a mode line, wherein said mode control signal controls said mode select register.

5. The system of claim 4, wherein said processing system includes a data generator for generating a sequence of de-skew signals on a bus.

6. The system of claim 5, wherein said processing system includes a circuit that produces timed strobe signals, and wherein said data checker compares said de-skew signals after they are delayed by the time of said strobe signals.

7. A method of WRITE training comprising the steps of:
   sending a plurality of predetermined data patterns to a memory device, wherein each predetermined data pattern is sent upon the occurrence of a master clock;
   sending a plurality of strobe signals, wherein the strobe signals are delayed relative to the master clock, and wherein the delay of at least two strobe signals are different;
   receiving the plurality of data patterns, wherein each data pattern is clocked in by a different strobe signal;
   comparing the received plurality of data patterns to the plurality of predetermined data patterns, wherein each received data pattern is compared to an associated predetermined data pattern to determine a comparison result; and setting the state of a data mask pin based on the comparison results.

8. The method of claim 7, wherein the step of sending a plurality of predetermined data patterns includes the step of generating a pseudo-random bit pattern.

9. The method of claim 8, wherein the step of generating a pseudo-random bit pattern includes applying a predetermined seed value to a pseudo-random generator.

10. The method of claim 9, wherein the step of comparing the received plurality of data patterns to the plurality of predetermined data patterns includes the step of generating a second pseudo-random bit pattern.

11. The method of claim 10, wherein the step of generating the second pseudo-random bit pattern includes the step of applying the predetermined seed value to a second pseudo-random generator.

12. A method of WRITE training, comprising the steps of
   setting a memory mode of a memory device to a WRITE TRAINING mode;
   converting the status of the memory device data mask pin to an output when the WRITE TRAINING mode is entered;
   sending a plurality of predetermined data patterns to the memory device, wherein each predetermined data pattern is sent upon the occurrence of a master clock;
   sending a plurality of strobe signals to the memory device, wherein the strobe signals are delayed relative to a master clock, and wherein the delay of at least two strobe signals are different;
   receiving the plurality of bit patterns, wherein each bit pattern is clocked in by a different strobe signal;
   comparing the received plurality of bit patterns to the plurality of predetermined bit patterns, wherein each received bit pattern is compared to an associated predetermined bit pattern to determine a comparison result; and
   setting the state of a data mask pin based on the comparison results.

13. The method of claim 12, wherein the step of sending the plurality of predetermined bit patterns includes the step of generating a pseudo-random bit pattern.

14. The method of claim 13, wherein the step of generating a pseudo-random bit pattern includes applying a predetermined seed value to a pseudo-random generator.

15. The method of claim 14, wherein the step of comparing the received plurality of bit patterns to the plurality of predetermined bit patterns includes the step of generating a second pseudo-random bit pattern.

16. The method of claim 15, wherein the step of generating the second pseudo-random bit pattern includes the step of applying the predetermined seed value to a second pseudo-random generator.

* * * * *